United States Patent
Chiang

(10) Patent No.: US 8,098,497 B2
(45) Date of Patent: Jan. 17, 2012

(54) EXPANSION CARD FASTENING MECHANISM

(75) Inventor: Jung-Sheng Chiang, Taipei (TW)

(73) Assignee: Compal Electronics, Inc., Taipei (TW)

(*) Notice: Subject to any disclaimer, the term of this patent is extended or adjusted under 35 U.S.C. 154(b) by 427 days.

(21) Appl. No.: 12/324,263

(22) Filed: Nov. 26, 2008

(65) Prior Publication Data

US 2009/0180264 A1 Jul. 16, 2009

(30) Foreign Application Priority Data

Jan. 16, 2008 (TW) ................................ 97101693 A

(51) Int. Cl.
*H05K 7/02* (2006.01)
*H05K 7/04* (2006.01)
(52) U.S. Cl. .................. 361/807; 361/810; 361/736
(58) Field of Classification Search .................. 361/747, 361/759, 801, 760, 720, 736, 748, 800, 807, 361/810, 726, 754, 796, 784, 725–732; 439/78, 439/325, 326, 328, 540.1, 541.5, 610, 638
See application file for complete search history.

(56) References Cited

U.S. PATENT DOCUMENTS

| | | | | |
|---|---|---|---|---|
| 535,100 A | * | 3/1895 | Lubanhn et al. | 340/550 |
| 4,398,780 A | * | 8/1983 | Novotny et al. | 439/284 |
| 4,506,937 A | * | 3/1985 | Cosmos et al. | 439/101 |
| 5,752,855 A | * | 5/1998 | Mehez et al. | 439/607.47 |
| 6,343,957 B1 | * | 2/2002 | Kuo et al. | 439/638 |
| 6,480,393 B1 | * | 11/2002 | Chen | 361/759 |
| 6,848,927 B2 | * | 2/2005 | Shirai | 439/326 |
| 7,184,278 B2 | * | 2/2007 | Tsai | 361/816 |
| 7,375,980 B2 | * | 5/2008 | Peng et al. | 361/801 |
| 7,503,792 B2 | * | 3/2009 | Xiao | 439/326 |
| 7,554,816 B2 | * | 6/2009 | Chang | 361/759 |
| 2007/0291460 A1 | * | 12/2007 | Chu | 361/801 |
| 2009/0111296 A1 | * | 4/2009 | Zhu | 439/78 |
| 2010/0165592 A1 | * | 7/2010 | Takao | 361/807 |

FOREIGN PATENT DOCUMENTS

TW 545850 8/2003

* cited by examiner

*Primary Examiner* — Hung S Bui
(74) *Attorney, Agent, or Firm* — Muncy, Geissler, Olds & Lowe, PLLC

(57) ABSTRACT

An expansion card fastening mechanism includes a baseboard, a card edge connector and a support bracket. The card edge connector is disposed on the baseboard to be inserted by an edge of an expansion card substantially in parallel with the baseboard. The support bracket includes a bottom wall, two lateral walls and two fastening members. The bottom wall is in contact with the baseboard. Two lateral walls extends upright from the bottom wall. Two fastening members are respectively disposed on a top edge of each lateral wall, wherein the bottom wall is selectively located at one of multiple positions on the baseboard such that an opposite edge of the expansion card is secured by the two fastening members.

8 Claims, 10 Drawing Sheets

US 8,098,497 B2

EXPANSION CARD FASTENING MECHANISM

RELATED APPLICATIONS

This application claims priority to Taiwan Application Serial Number 97101693, filed Jan. 16, 2008, which are herein incorporated by reference.

BACKGROUND

1. Field of Invention

The present invention relates to a printed circuit board fastening mechanism. More particularly, the present invention relates to an expansion card fastening mechanism.

2. Description of Related Art

Referring to FIG. 1 and FIG. 2, two expansion card fastening mechanisms are illustrated to secure a short card and a long card. In order to satisfy the market demands, all electronic devices are made thin and equipped with various functionalities. For this purpose, component providers integrate each functionality into single one module card to enable each modulized functionality to be conveniently added onto an electronic device. For instances, the short card 110a and the long card 110b are module card. The card edge connectors 104 for engaging the short card 110a and the long card 110b are of the same size and specification. However, the baseboard 102 needs several screw holes and support columns to secure both the short card 110a and the long card 110b thereon. For example, columns 106a and screws 108 are used to secure the short card 110a on the baseboard 102, and columns 106b and screws 108 are used to secure the long card 110b on the baseboard 102. Since the columns 106a and columns 106b should be located differently to secure the short card 110a or the long card 110b on the baseboard 102, the baseboard 102 requires at least four screw holes. In case the columns 106a and columns 106b are simultaneously located on the baseboard 102 (see FIG. 3), the long card 110b would not be properly secured thereon because the columns 106a interfere the long card 110b. In addition, screw holes would reduce the area to be occupied by printed circuits. For the forgoing reasons, there is a need for improving the expansion card fastening mechanism.

SUMMARY

It is therefore an objective of the present invention to provide an expansion card fastening mechanism.

In accordance with the foregoing and other objectives of the present invention, an expansion card fastening mechanism includes a baseboard, a card edge connector and a support bracket. The card edge connector is disposed on the baseboard to be inserted by an edge of an expansion card substantially in parallel with the baseboard. The support bracket includes a bottom wall, two lateral walls and two fastening members. The bottom wall is in contact with the baseboard. Two lateral walls extends upright from the bottom wall. Two fastening members are respectively disposed on a top edge of each lateral wall, wherein the bottom wall is selectively located at one of multiple positions on the baseboard such that an opposite edge of the expansion card is secured by the two fastening members.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1-3 respectively illustrates three different conventional expansion card fastening mechanisms.

DESCRIPTION OF THE PREFERRED EMBODIMENTS

Figure 1:
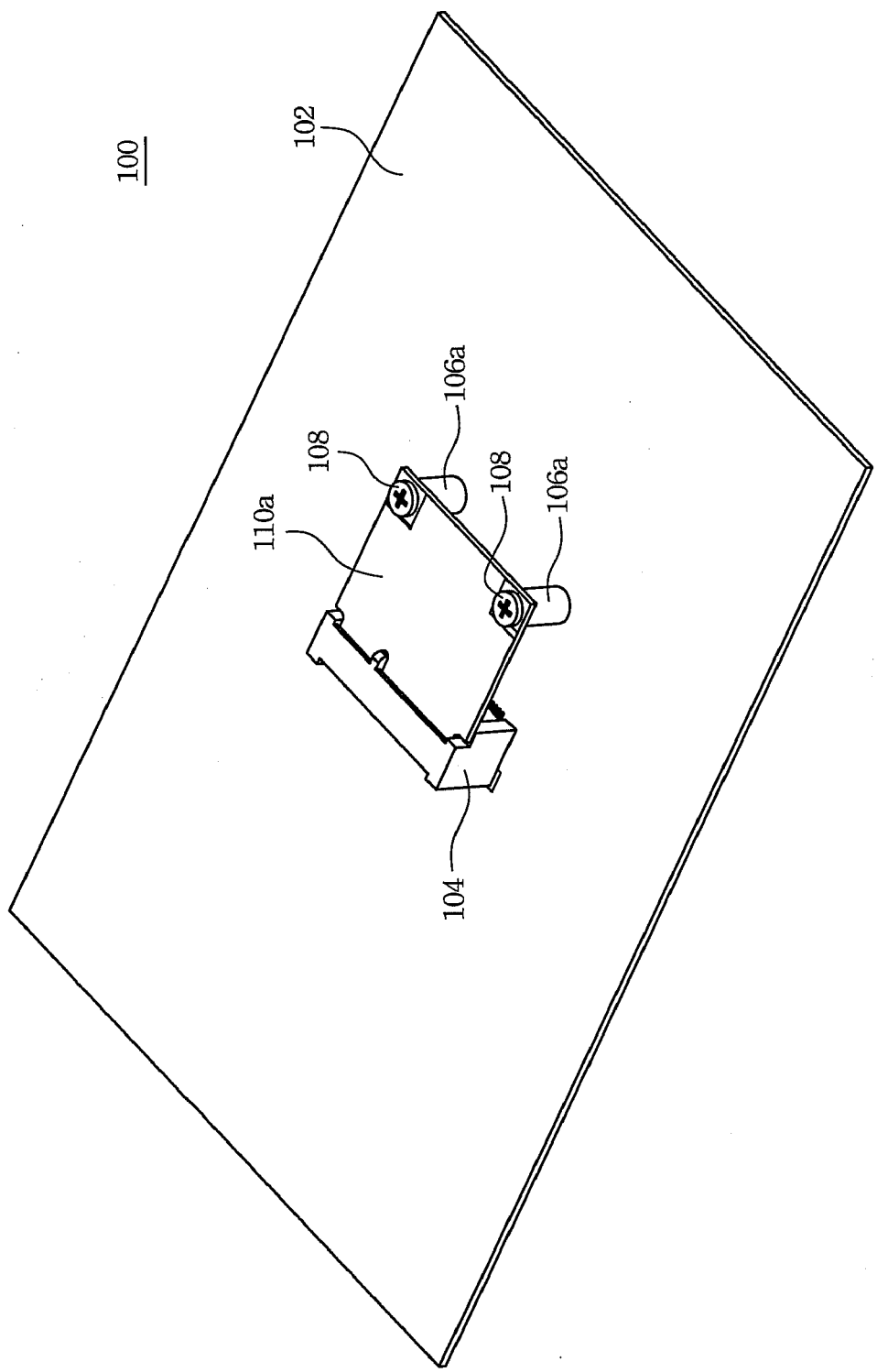
Figure 2:
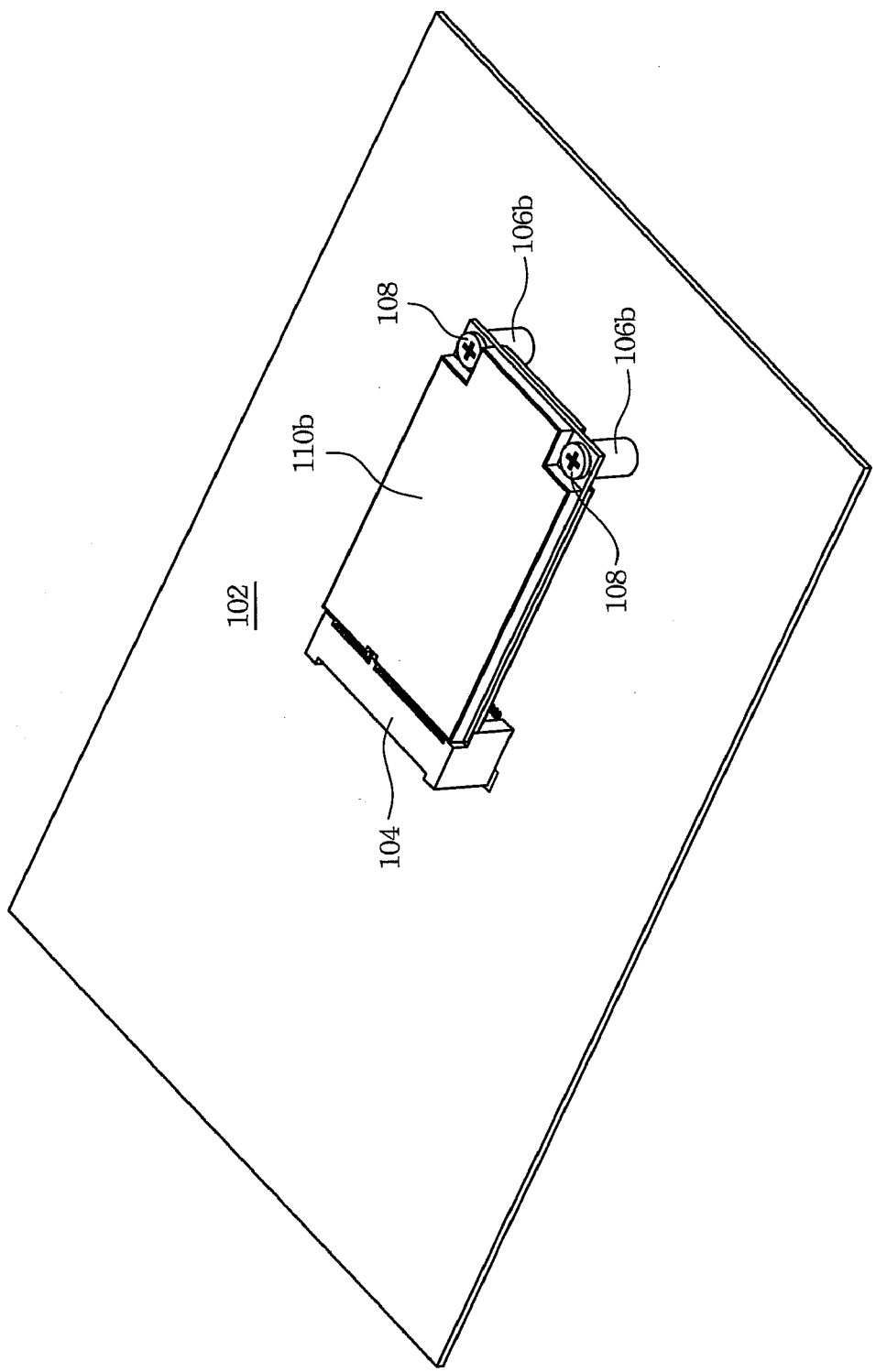
Figure 3:
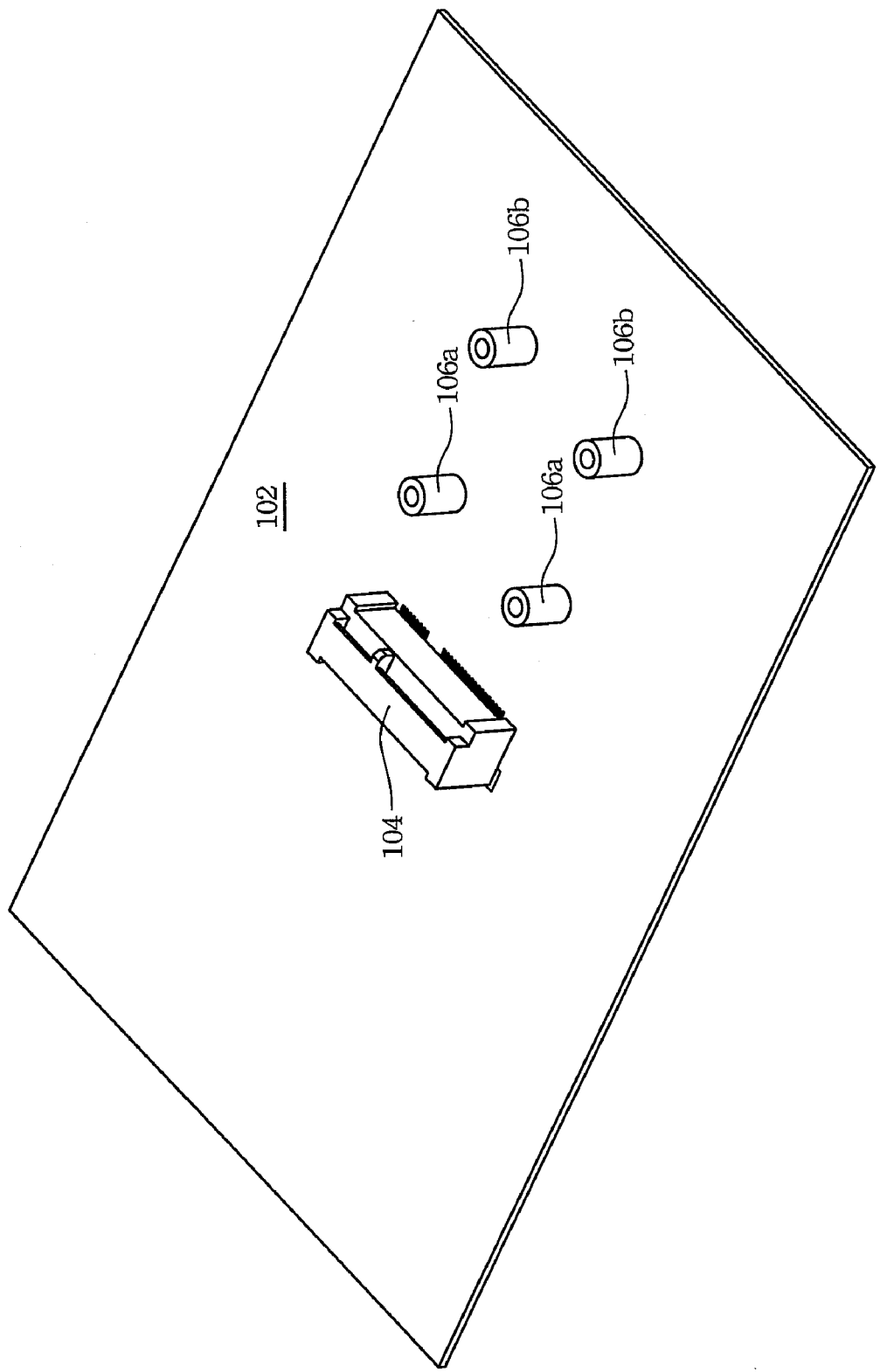

Reference will now be made in detail to the present preferred embodiments of the invention, examples of which are illustrated in the accompanying drawings. Wherever possible, the same reference numbers are used in the drawings and the description to refer to the same or like parts.

Figure 4:
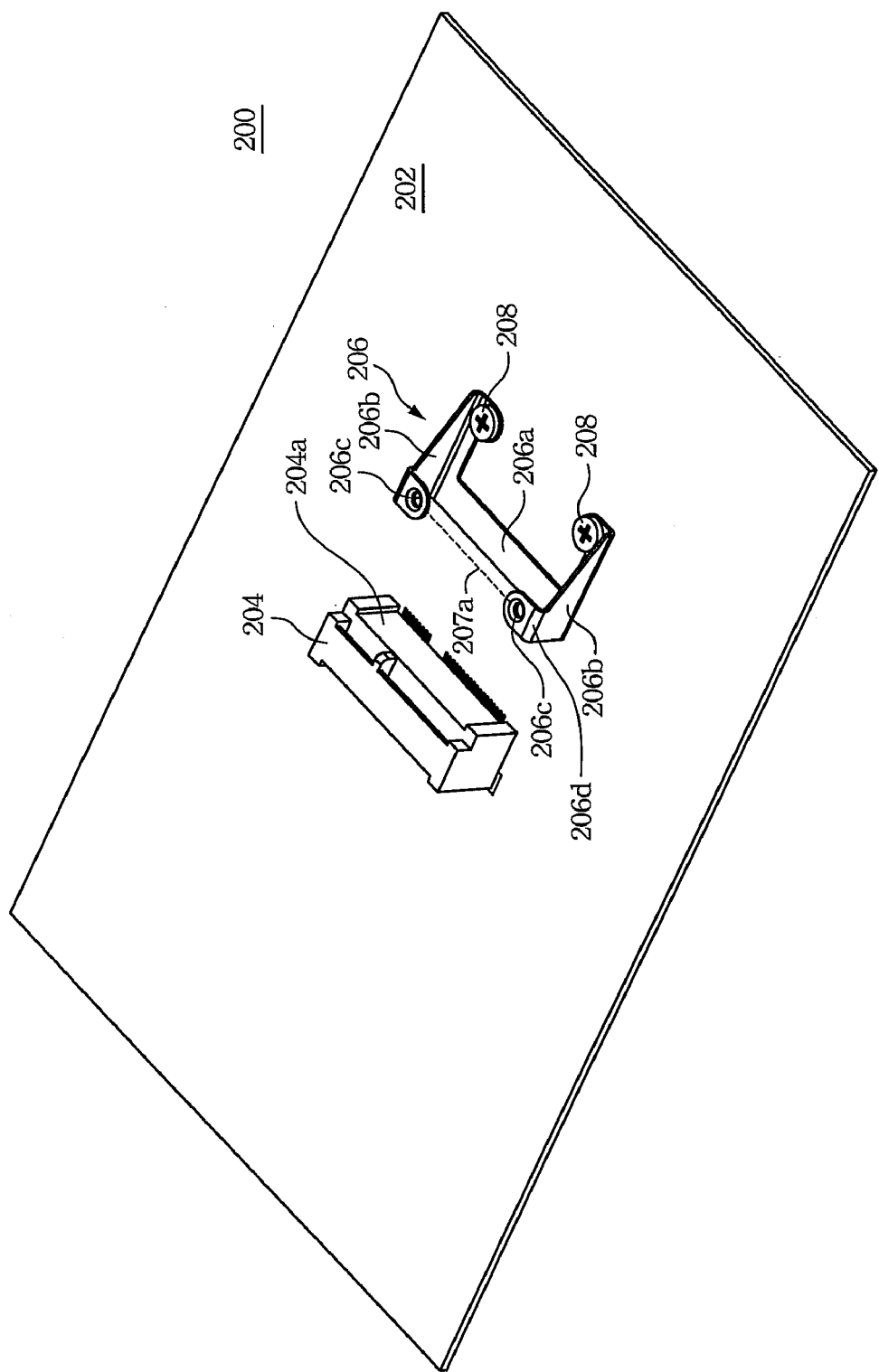
FIG. 4 illustrates an expansion card fastening mechanism according to one preferred embodiment of this invention.
Figure 5:
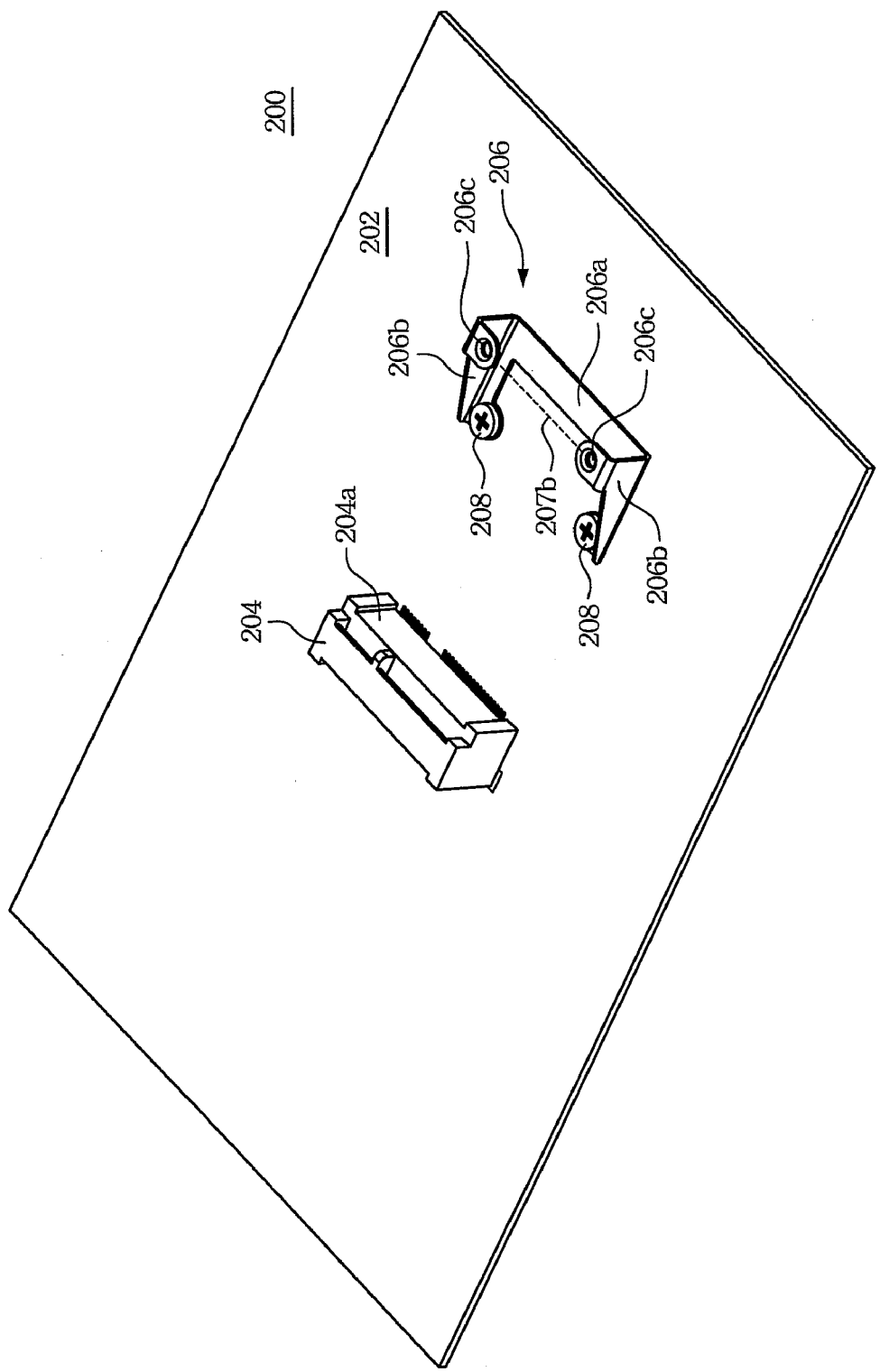
FIG. 5 illustrates the expansion card fastening mechanism in FIG. 4 with its support bracket turned to face in the opposite direction.

FIG. 4 and FIG. 5 respectively illustrate two status of an expansion card fastening mechanism according to one preferred embodiment of this invention. An expansion card fastening mechanism 200 includes a baseboard 202 (such as a printed circuit board), a card edge connector 204 and a support bracket 206. The support brackets 206 as illustrated in FIG. 4 and FIG. 5 face in two opposite directions such that expansion cards of relatively short length and relatively long length can be respectively secured on the expansion card fastening mechanism 200 as illustrated in FIG. 4 and FIG. 5.

The support bracket.206 includes a bottom wall 206a, two lateral walls 206b and two fastening members (such as screw hole 206c). Two lateral walls 206b extend upright from two opposite edges of the bottom wall 206a and are in parallel with each other. Two lateral walls 206b are substantially perpendicular to the bottom wall 206a. An interval between two lateral walls 206b is substantially equal to a connection edge 204a of the card edge connector 204. Two screw holes 206c are respectively designed on top edges of two lateral walls 206b.

Although there only two screw holes on the baseboard 202, the support brackets 206 can be secured on the baseboard 202 by two ways (see FIG. 4 and FIG. 5). In this embodiment, virtual lines (207a, 207b) are substantially in parallel with the connection edge 204a of the card edge connector 204.

Figure 6:
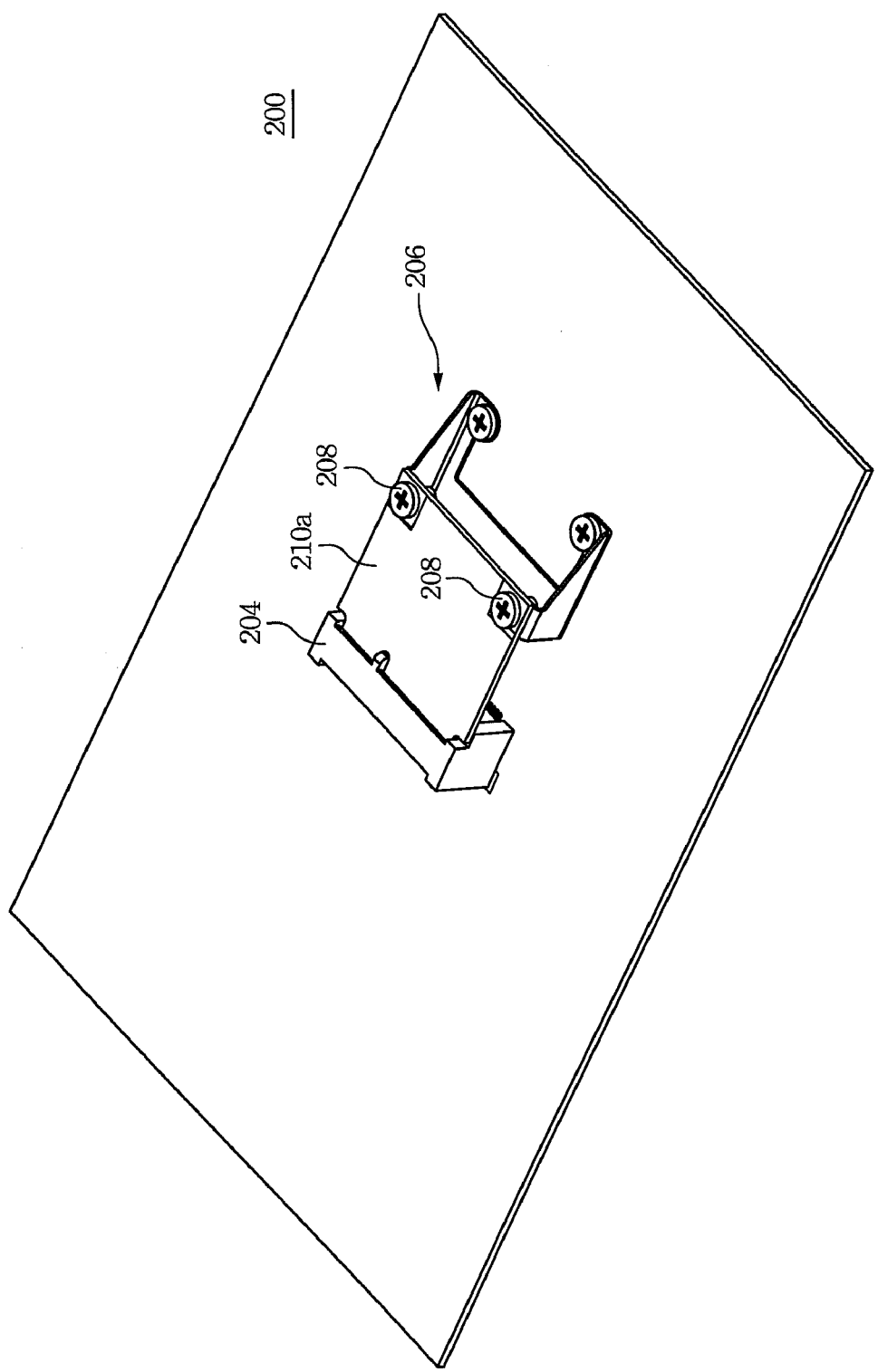
FIG. 6 illustrates the expansion card fastening mechanism in FIG. 4 being inserted by a relatively short expansion card.

Referring FIG. 4 and FIG. 6, the virtual line 207a is closer to the card edge connector 204 (compared with the virtual line 207b), an expansion card of relatively short length can be secured in parallel with the baseboard 202 with its one edge inserted into the connection edge 204a of the card edge connector 204 and its opposite edge fastened by screws 208 on top of the support bracket 206.

Figure 7:
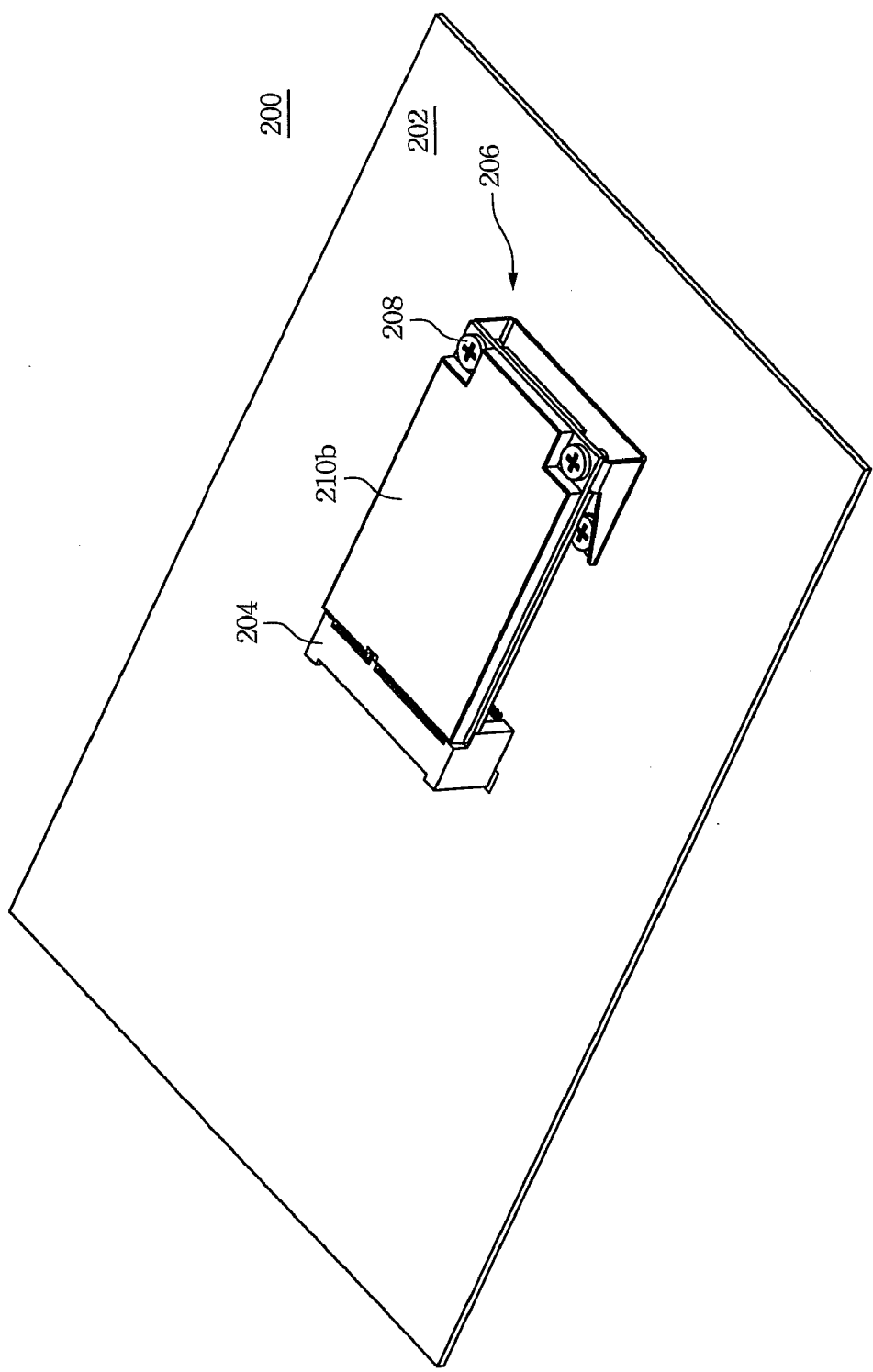
FIG. 7 illustrates the expansion card fastening mechanism in FIG. 5 being inserted by a relatively long expansion card.

Referring FIG. 5 and FIG. 7, the virtual line 207b is closer to the card edge connector 204 (compared with the virtual line 207a), an expansion card of relatively long length can be secured in parallel with the baseboard 202 with its one edge inserted into the connection edge 204a of the card edge connector 204 and its opposite edge fastened by screws 208 on top of the support bracket 206.

Figure 8:
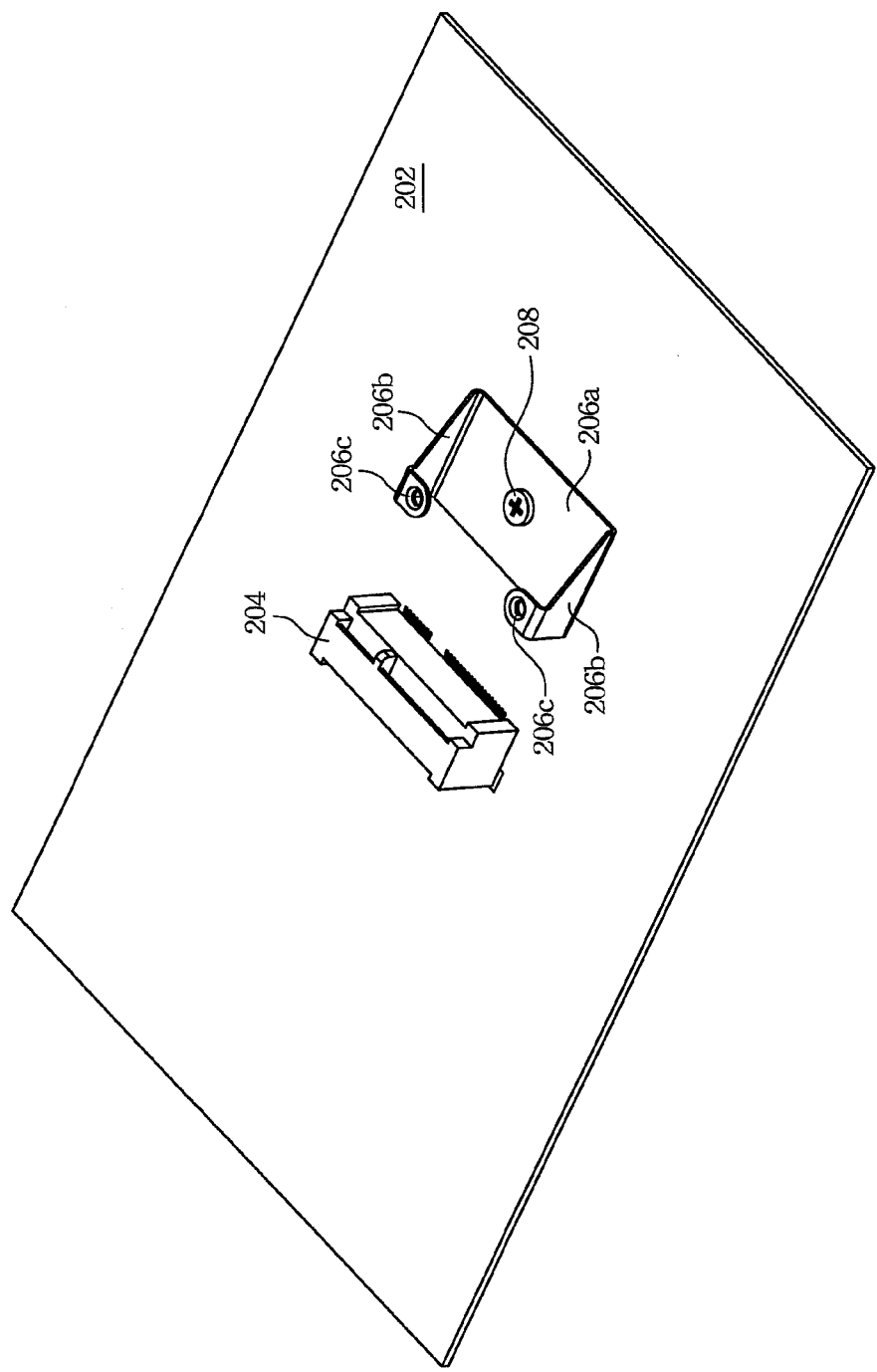
FIG. 8 illustrates an expansion card fastening mechanism according to another preferred embodiment of this invention.
Figure 9:
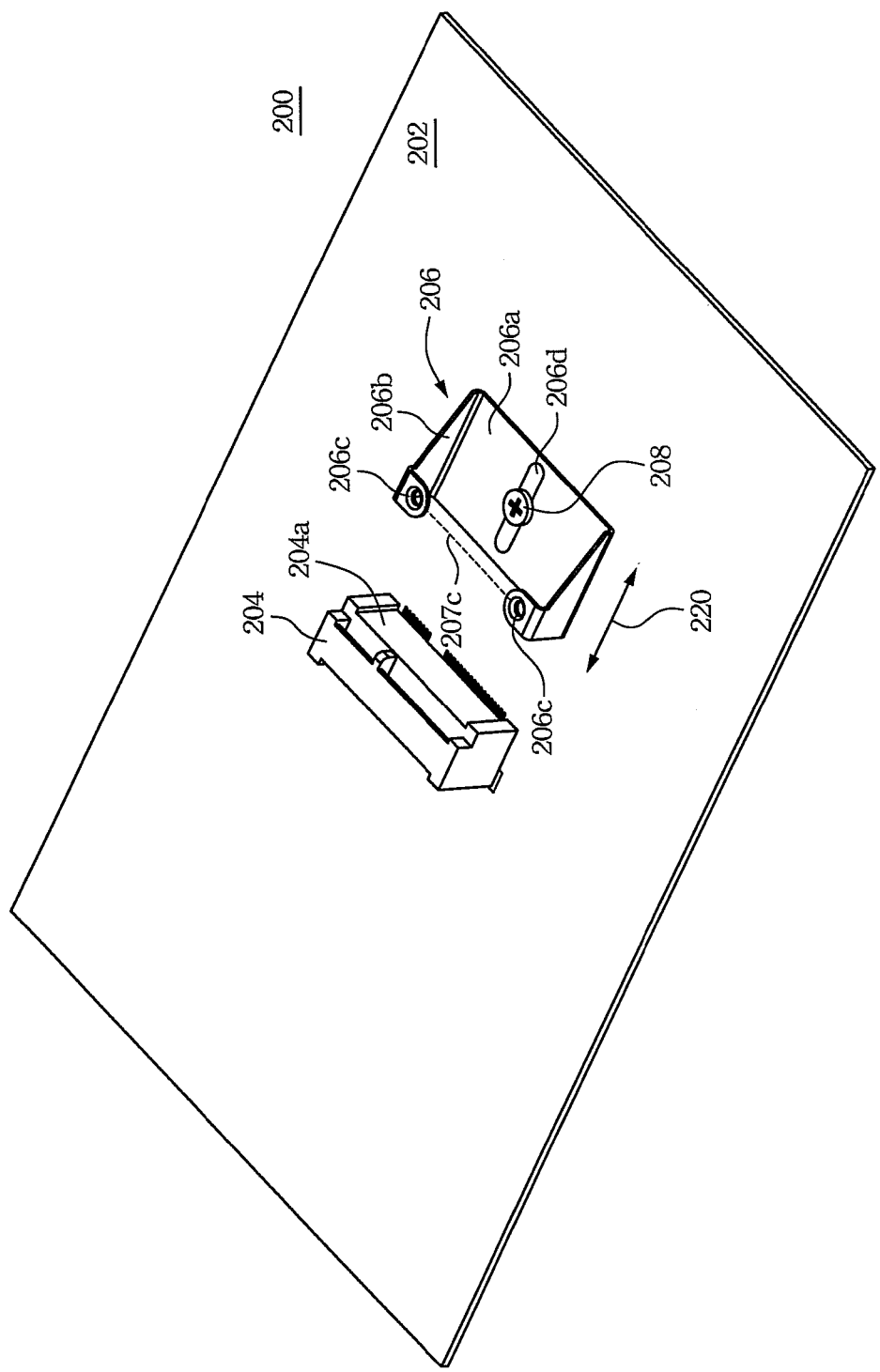
FIG. 9 illustrates an expansion card fastening mechanism according to still another preferred embodiment of this invention.

There are still other ways to secure the support bracket 206 on the baseboard 202. Referring to FIG. 8, the bottom wall of the support bracket 206 has only one through hole to be screwed through in order to secure the support bracket 206 on the baseboard 202. In this case, the support bracket 206 can also be secured on the baseboard 202 with the same way as illustrated in FIG. 4 and FIG. 5. Referring to FIG. 9, the through hole 206d on the support bracket 206 can be a prolonged one for users to adjust an interval between the support bracket 206 and the card edge connector 204. The through hole 206d extends or prolongs along a direction substantially perpendicular to a virtual line 207c. As long as the virtual line 207c is substantially in parallel with the connection edge 204a of the card edge connector 204, the support bracket 206 can be adjusted to a desired position along a direction 220 (substantially perpendicular to the connection edge 204a). Thus, the support bracket 206 can be adjusted to multiple positions on the baseboard 202, which allows expansion cards of different lengths to be secured on the support bracket 206. In addition, the support bracket 206 can also be secured on the baseboard 202 with the same way as illustrated in FIG. 4 and FIG. 5.

Figure 10:
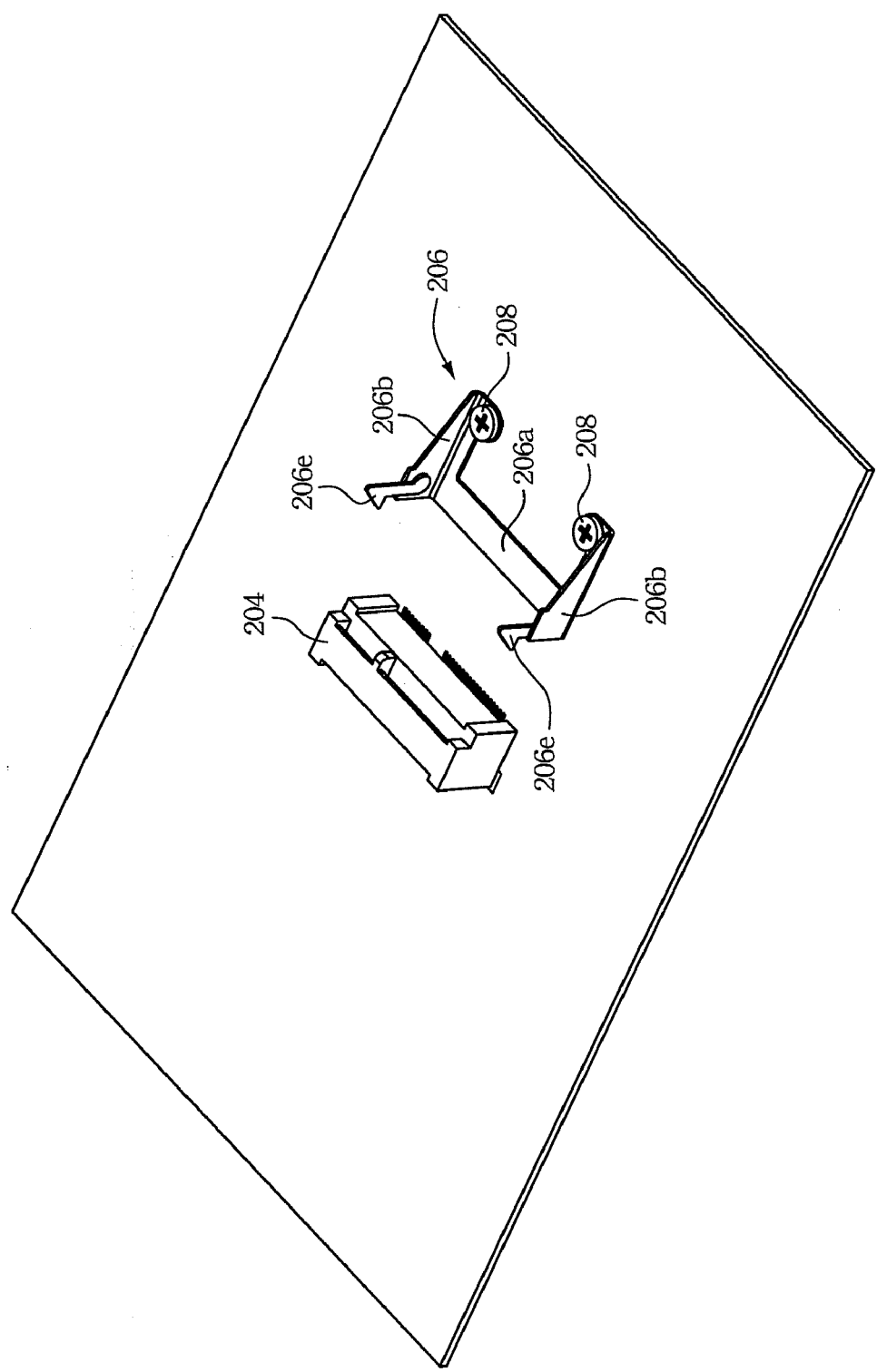
FIG. 10 illustrates an expansion card fastening mechanism according to further still another preferred embodiment of this invention.

The fastening member of the support bracket 206 should not be limited to the screw hole 206c. Referring to FIG. 10, the fastening member is a hook end 206e on top of the lateral walls 206b. The hook end 206e is to engage a through hole of the expansion card. The hook end 206e is a resilient member attached on the lateral walls 206b such that the expansion card can be steadily fastened upon the resilient hook end 206e.

According to discussed embodiments, the present invention provides an expansion card fastening mechanism with an adjustable interval between its card edge connector and its support bracket such that an expansion card of different length can be secured thereon.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An expansion card fastening mechanism, comprising:
a printed circuit board comprising a fixed portion and the fixed portion having a screw hole;
a card edge connector disposed on the printed circuit board; and
a support bracket selectively disposed on the fixed portion of the printed circuit board in a first fixed status or a second fixed status and comprising:
a bottom wall in contact with the printed circuit board;
two lateral walls extends upward from the bottom wall; and
two fastening members respectively disposed on a top edge of each lateral wall, wherein:
when the support bracket is used in a first way to be fastened to the screw hole of the fixed portion of the printed circuit board in the first fixed status, a first interval is defined between the two fastening members and the card edge connector,
when the support bracket is used in a different second way to be fastened to the screw hole of the fixed portion of the printed circuit board in the second fixed status, a second interval is defined between the two fastening members and the card edge connector, the first interval being smaller than the second interval.

2. The expansion card fastening mechanism of claim 1, wherein each fastening member comprises a screw hole and a screw.

3. The expansion card fastening mechanism of claim 1, wherein each fastening member comprises a hook end.

4. The expansion card fastening mechanism of claim 1, wherein the two lateral walls are in parallel with each other, and a distance between the two lateral walls is substantially equal to a connection edge of the expansion card.

5. The expansion card fastening mechanism of claim 1, wherein the bottom wall comprises only one single through hole for a bolt to be screwed through.

6. The expansion card fastening mechanism of claim 1, wherein the bottom wall comprises a prolonged through hole for a bolt to be screwed through.

7. The expansion card fastening mechanism of claim 1, wherein the two lateral walls are substantially perpendicular to the bottom wall.

8. The expansion card fastening mechanism of claim 1, wherein the support bracket faces in two opposite directions when the support bracket is used in the first way and in the second way to be fastened to the screw hole of the fixed portion.

* * * * *